United States Patent
Gorbold

(10) Patent No.: US 8,624,764 B2
(45) Date of Patent: Jan. 7, 2014

(54) TEST CIRCUITS AND METHODS FOR REDUNDANT ELECTRONIC SYSTEMS

(75) Inventor: Jeremy Gorbold, Newbury (GB)

(73) Assignee: Analog Devices, Inc., Norwood, MA (US)

( * ) Notice: Subject to any disclaimer, the term of this patent is extended or adjusted under 35 U.S.C. 154(b) by 28 days.

(21) Appl. No.: 13/371,297

(22) Filed: Feb. 10, 2012

(65) Prior Publication Data

US 2012/0206282 A1  Aug. 16, 2012

Related U.S. Application Data

(60) Provisional application No. 61/441,946, filed on Feb. 11, 2011.

(51) Int. Cl.
*H03M 1/10*  (2006.01)

(52) U.S. Cl.
USPC ........................................ 341/120; 341/155

(58) Field of Classification Search
USPC ......................................... 341/120, 118, 155
See application file for complete search history.

(56) References Cited

U.S. PATENT DOCUMENTS

| | | | |
|---|---|---|---|
| 7,079,060 B2 * | 7/2006 | Tarui et al. | 341/120 |
| 7,256,602 B2 * | 8/2007 | Mattes et al. | 324/750.02 |
| 7,271,751 B2 * | 9/2007 | Peterson et al. | 341/120 |
| 7,724,169 B2 * | 5/2010 | Boisvert | 341/141 |
| 2011/0172940 A1 | 7/2011 | Wood et al. | |

* cited by examiner

*Primary Examiner* — Brian Young
(74) *Attorney, Agent, or Firm* — Kenyon & Kenyon, LLP

(57) ABSTRACT

A redundant analog-to-digital conversion system can include at least one input multiplexer, first and second redundant analog-to-digital converters, a comparison circuit and an output multiplexer. The at least one input multiplexer can receive a plurality of analog input signals and output at lest one multiplexed analog input signal. The first and second redundant analog-to-digital converters can convert the at least one multiplexed analog input signal to respectively generate first and second digital output signals, the first digital output having a greater digital resolution than the second digital output. The comparison circuit can produce a comparison output signal as a function of a comparison of a plurality of most significant corresponding bit pairs of the first and second digital output signals. The output multiplexer can produce a multiplexed output including information from the comparison output signal and one of the digital output signals.

31 Claims, 5 Drawing Sheets

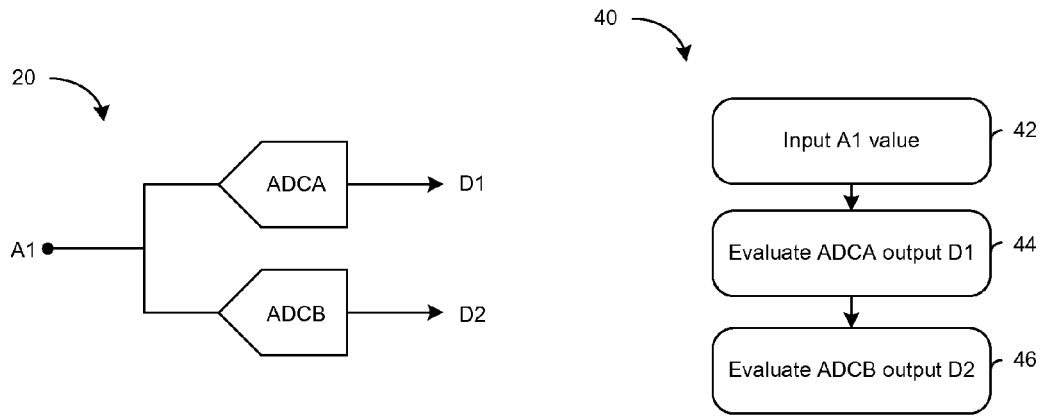
FIG. 1
(prior art)
FIG. 2
(prior art)
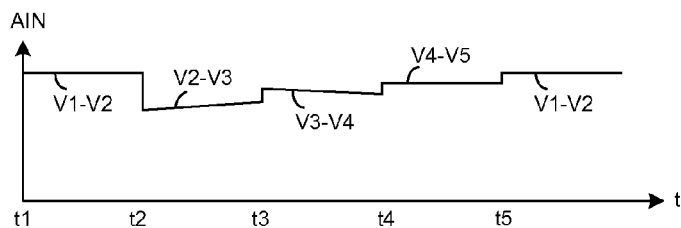
FIG. 4
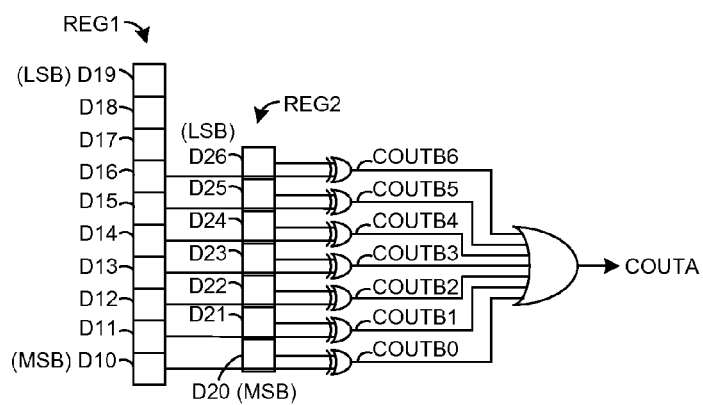
FIG. 5

TEST CIRCUITS AND METHODS FOR REDUNDANT ELECTRONIC SYSTEMS

CROSS-REFERENCE TO RELATED APPLICATIONS

This application is a non-provisional of, and claims priority to, U.S. Provisional Patent Application No. 61/441,946, filed on Feb. 11, 2011, which is herein incorporated by reference in its entirety.

BACKGROUND INFORMATION

Some electronic systems utilize redundancy to fulfill safety, functionality and performance requirements. For example, a road-vehicle functional safety standard now under development, ISO 26262, requires varying degrees of redundancy in sensors, processing channels, actuators, interconnections and energy supplies to implement vehicle functionality at various automotive safety integrity levels (ASILs). ISO 26262 seeks to meet safety goals at many phases of the automotive product cycle, including during development, production, operation and servicing of road vehicles. Other standards also mandate redundancy for electronic systems other than road vehicles.

FIG. 1 depicts an embodiment of a redundant analog-to-digital conversion system 20. The system 20 includes two conversion channels, each having a separate analog to digital converter ADCA, ADCB. Each of the converters ADCA, ADCB receives the same analog input A1, and produces a separate corresponding digital output D1, D2 representing the conversion to the digital realm of the received analog input A1.

Such a redundant conversion system 20 needs to be tested to meet safety standards. FIG. 2 depicts an embodiment of a method 40 of testing the conversion system 20 of FIG. 1. In a first step 42, a particular value of the analog input A1 is provided to the first and second converters ADCA, ADCB. At a second step 44, the output D1 of the first converter ADCA is evaluated. This evaluation can include various sub-steps, such as determining if the output D1 is the correct digital code to correspond to the particular analog input value, and determining whether the digital output D1 meets other performance measures in relation to previous digital output values, such as measures related to linearity, offset error, gain error, signal-to-noise ratio, total harmonic distortion, etc. At a third step 46, the digital output D2 of the second converter ADCB is evaluated. This evaluation can also include various sub-steps, such as those identified above.

The conversion system 20 and test method 40 of FIGS. 1-2 have shortcomings, however. Foremost among these is the fact that each of the converters ADCA, ADCB is separately tested to ensure safety. As each of the corresponding evaluation steps 44, 46 can be a time intensive procedure, separately testing each converter ADCA, ADCB can be inefficient in both manufacturing and operational environments. Additionally, the conversion system 20 of FIG. 1 provides no functionality or output signal that is related to the performance and safety status of the redundancy of the system 60, i.e., related to the performance and safety status of both the first and second converters ADCA, ADCB.

Thus, there exists a need for electronic systems that can implement redundancy to meet functionality and safety concerns, but that do not necessarily require full redundancy for testing in manufacturing, operational or servicing environments.

BRIEF DESCRIPTION OF THE DRAWINGS

So that features of the present invention can be understood, a number of drawings are described below. However, the appended drawings illustrate only particular embodiments of the invention and are therefore not to be considered limiting of its scope, for the invention may encompass other equally effective embodiments.

FIG. 1 is a circuit schematic depicting a conversion system.
FIG. 2 is a flowchart depicting a testing method for the conversion system of FIG. 1.
FIG. 4 is a signal diagram depicting an embodiment of a multiplexed analog signal of the redundant conversion system of FIG. 3.
FIG. 5 is a circuit schematic depicting an embodiment of a comparison circuit of the redundant conversion system of FIG. 3.

DETAILED DESCRIPTION

A redundant analog-to-digital conversion system can include an input multiplexer, a plurality of redundant analog-to-digital converters, a comparison circuit, an output multiplexer, and a control circuit. The redundant conversion system can implement an improved safety, functionality and performance testing for the redundant converters that eliminates or reduces undesirably time-consuming full evaluations of both of their digital outputs. The improved testing can include a relatively full evaluation of a primary converter output and a relatively abbreviated evaluation of a secondary converter output, with the abbreviated second-converter evaluation performed in part by the comparison circuit comparing digital outputs from both of the converters to produce a comparison output as a test measure. The redundant electronic conversion system can thus perform testing of both converters to satisfy safety, functionality and performance specifications, while offering improved testing efficiency.

Figure 3:
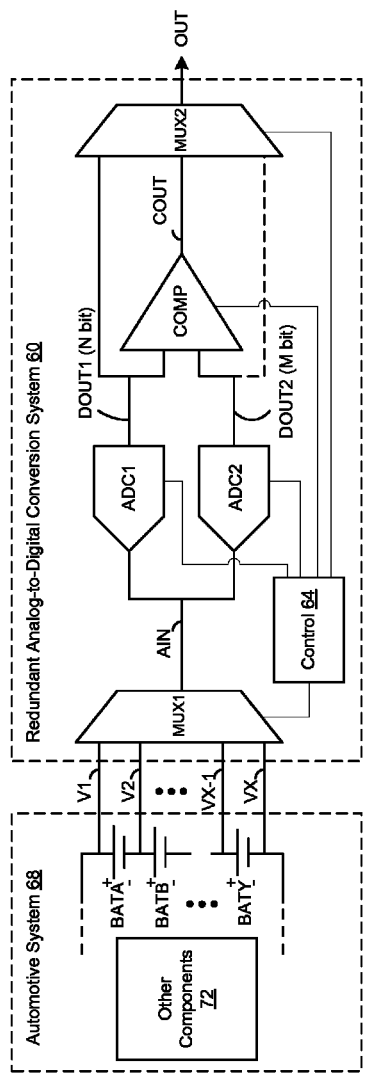
FIG. 3 is a circuit schematic depicting an embodiment of a redundant analog-to-digital conversion system.

FIG. 3 is a simplified block diagram depicting an embodiment of a redundant analog-to-digital conversion system 60. The redundant conversion system 60 can include an input (first) multiplexer MUX1; primary and secondary (first and second) redundant analog-to-digital converters ADC1, ADC2; a comparison circuit COMP; an output (second) multiplexer MUX2; and a control circuit 64.

In summary, the first multiplexer MUX1 can receive a plurality of analog voltages V1-VX, multiplex the plurality of voltages V1-VX under the control of the control circuit 64, and produce a multiplexed analog input signal AIN to each of the converters ADC1, ADC2. The first and second converters ADC1, ADC2 each can convert the analog input signal AIN to produce corresponding first and second digital output signals DOUT1, DOUT2, each representing a digitization of the same analog input signal AIN, but having different first and second digital resolutions. The two digital outputs DOUT1, DOUT2 can then be delivered to the comparison circuit COMP, which can implement a comparison of the first digital output DOUT1 to the second digital output DOUT2 to produce a comparison output signal COUT. The second multiplexer MUX2 can receive the first digital output DOUT1 and the comparison output COUT, and multiplex these signals together to produce a single output signal OUT from the redundant conversion system 60. The control circuit 64 can generate and deliver control signals to control the operation of the other components of the conversion system 60.

In more detail, during regular operation in an automotive system 68, the first multiplexer MUX1 can receive a plurality of analog voltages V1-VX from components of the automotive system 68 for multiplexing and eventual conversion to digital signals. The plurality of components providing the analog voltages V1-VX can be a plurality of batteries BATA-BATY, which may also be connected to other automotive components 72. The first multiplexer MUX1 can multiplex the plurality of voltages V1-VX under the control of the control circuit 64 to produce a single analog input signal AIN that can be delivered to each of the plurality of converters ADC1, ADC2. The single analog signal AIN can include multiplexed information from each of the plurality of analog voltages received by the multiplexer MUX1. In a typical embodiment, the first multiplexer MUX1 may output each of the plurality of input voltages V1-VX individually as the analog input signal AIN in a selected order in time, so that the analog input signal AIN can represent a repeating series of snapshots of the received plurality of voltages V1-VX. In another embodiment, the first multiplexer MUX1 may output a series of voltages based on selected combinations of the received plurality of voltages V1-VX in a selected order in time. The analog input signal AIN output by the first multiplexer MUX1 can be a single-ended or differential analog signal.

FIG. 4 depicts an embodiment of exemplary multiplexed analog input signal AIN that that can be output from the first multiplexer MUX1 of FIG. 3. In FIG. 4, the multiplexer MUX1 can output a multiplexed analog signal AIN equal to each of the battery voltages in a selected order in time. Specifically, the analog input signal AIN can equal the first battery voltage, or AIN=V1-V2, from a first time t1 to a second time t2; the second battery voltage, or AIN=V2-V3, from the second time t2 to a third time t3; a third battery voltage, or AIN=V3-V4, from the third time t3 to a fourth time t4; and a fourth battery voltage, or AIN=V4-V5, from a fourth time t4 to a fifth time t5. The multiplexer MUX1 can then cycle back through the sequence, and output again, in order, as the value of the multiplexed analog input signal AIN repeatedly in time. Other compositions of the multiplexed analog input voltage AIN, based on various sequences of the multiplexer input voltages V1-VX or combinations thereof, can also be selected by the control circuit 64.

During performance and safety testing of the redundant conversion system 60, either during or not during regular conversion operation, the first multiplexer MUX1 can also receive from the control circuit 64, and output as the analog input signal AIN, selected test signals instead of selected combinations of the received plurality of automotive voltages V1-VX. In this way, testing of the redundant converters ADC1, ADC2 can be conducted using predetermined analog signal values instead of real-time operational values of the received plurality of automotive input voltages V1-VX. Specific exemplary testing procedures are discussed further below, e.g., in regard to a test method 600 depicted in FIG. 7.

The two analog-to-digital converters ADC1, ADC2 can be redundant to each other, and convert the same analog input signal AIN to produce respective digital output signals DOUT1, DOUT2, each having individual values representing separate digitizations of the same corresponding analog input signal values. Although redundant to each other, each of the converters ADC1, ADC2 may have different properties. One of the converters may be a primary converter ADC1, and meet relatively higher performance specifications, and the other converter be a secondary converter ADC2, and meet only relatively lower performance specifications. Specifically, the first converter ADC1 may convert at and produce a digital output DOUT1 having a first predetermined bit resolution (also known as a bit width) of, e.g., N bits, and the second converter ADC2 may convert at and produce a digital output DOUT2 having a second predetermined bit resolution of, e.g., M bits, where the first predetermined bit resolution N is greater than the second predetermined bit resolution M, i.e., N>M. Such a configuration may be useful when the redundant conversion system 60 ordinarily relies upon the primary converter ADC1 during normal conversion operation, but may need to rely upon the secondary converter ADC2 to provide backup conversion for safety purposes from time to time. The first and second converters ADC1, ADC2 can each be of any analog-to-digital converter type, including any of a pipelined converter, flash converter, sigma-delta converter, etc., and can either both be of the same converter type, or each be of a different converter type.

The first and second digital outputs DOUT1, DOUT2 can be delivered to the comparison circuit COMP. The comparison circuit COMP can implement a comparison of the outputs DOUT1, DOUT2 to produce one or more comparison output signals COUT, potentially including one or more of an overall comparison output COUTA and a plurality of bitwise comparison outputs COUTBi (i.e., COUTB0, COUTB1, . . . COUTBi) as part of an abbreviated test measure of the second converter ADC2. Ideally, in embodiments of the redundant conversion system 60, if both converters ADC1, ADC2 are working properly, the digital outputs DOUT1, DOUT2 should be identical in corresponding bit positions at any given time. For example, if the first converter ADC1 has a bit resolution of, e.g., 10 bits, and the second converter has a bit resolution of, e.g., 7 bits, then the 7 most significant bits of the first digital output DOUT1 should be the same as the 7 bits of the second digital output DOUT2 if both converters ADC1, ADC2 are operating without error. A test method can therefore be implemented to test the operation of both the converters ADC1, ADC2 by first performing a relatively full evaluation of the first digital output DOUT1, to test the first converter's performance; and then, second, performing a relatively abbreviated evaluation of the second digital output DOUT2 to test the second converter's performance by performing a bitwise comparison of the second digital output DOUT2 to corresponding bits of the first digital output DOUT1 to evaluate the similarity of the corresponding bits of the two outputs DOUT1, DOUT2. In such a test method, the performance of the second converter can be evaluated by the comparison of the similarity between the first and second digital outputs DOUT1, DOUT2, coupled with the more standard test measure of the first digital output DOUT1. Such a method can thus enable testing of both converters ADC1, ADC2 to meet applicable safety standards, while eliminating or reducing the necessity of conducting full evaluations of the digital outputs DOUT1, DOUT2 of both converters ADC1, ADC2.

The comparison performed by the comparison circuit COMP can provide a measure of whether and the degree to which the first and second digital outputs DOUT1, DOUT2 are the same for a given value of the analog input AIN. The output COUT of the comparison circuit COMP can include one or more of the overall comparison output COUTA and the plurality of bitwise comparison outputs COUTBi. The overall comparison output COUTA can be a single digital bit that indicates whether the bits of the second digital output DOUT2 match each of the corresponding most significant bits of the first digital output DOUT1 either exactly or to within a predetermined or selectable degree. The overall comparison output COUTA can therefore represent a one-bit test measure of the second converter ADC2 in combination with a fuller evaluation of the first converter ADC1. In one embodiment, the overall comparison output COUTA can represent a relatively exacting comparison of the first and second digital outputs DOUT1, DOUT2, with the overall comparison output COUTA indicating whether each of the bits of the second digital output DOUT2 match each of the corresponding most significant bits of the first digital output DOUT1. In another embodiment, the overall comparison output COUTA can represent a relatively more relaxed comparison of the first and second digital outputs DOUT1, DOUT2, with the overall comparison output COUTA indicating whether a predetermined or selectable number of the most significant bits of the second digital output DOUT2 match each of the corresponding most significant bits of the first digital output DOUT1. In this embodiment, the predetermined or selectable number of bits required to produce a match can be controlled by or using the control circuit 64.

The individual bitwise comparison outputs COUTBi can include a single bit for each pair of corresponding bits of the first and second digital outputs DOUT1, DOUT2. For example, for a seven-bit second digital output DOUT2, the bitwise comparison output COUTBi can include seven bitwise comparison bits COUTB0-COUTB6, each indicating whether a respective one of the seven corresponding bit pairs of the first and second digital outputs DOUT1, DOUT2 match. The bitwise comparison output COUTBi can thus represent a multi-bit test measure of the second converter ADC2, in combination with a fuller evaluation of the first converter ADC1, and provide a more detailed measure of which of the corresponding bits of the first and second digital outputs DOUT1, DOUT2 are the same and which are different.

The second multiplexer MUX2 can receive the first digital output DOUT1, the one or more comparison outputs COUT, and optionally the second digital output DOUT2, and multiplex these signals together to produce a single output signal OUT from the redundant conversion system 60. The single output OUT can be a digital signal, having either a serial or parallel format, and having one or more bits representing one or more of the first digital output DOUT1, the second digital output DOUT2, the overall comparison output COUTA, and the various bitwise comparison outputs COUTBi. In one embodiment, the single output OUT may only include each of the bits of the first digital output DOUT1 and the single bit of the overall comparison output COUTA. Such an embodiment of the output signal OUT can be a compact output OUT providing both the complete first digital output DOUT1, for either testing or operational use of the first converter ADC1, and a convenient form of the abbreviated test measure of the second converter ADC2, which can also be used during either testing or regular operation. Other compositions of the output signal OUT can also be selected by the control circuit 64 during testing and regular operation. For example, the control circuit 64 can control the second multiplexer MUX2 to switch from the relatively compact output OUT discussed immediately above, i.e., including only the full first digital output DOUT1 and the overall comparison output COUTA, to a more detailed output format including, e.g., the full first digital output DOUT1 and each of the bitwise comparison outputs COUTBi, which may be suitable for use in further testing upon a preliminary indication by the overall comparison output COUTA that the first and second digital outputs DOUT1, DOUT2 do not completely match. Specific examples of testing procedures for use with the redundant conversion system 60 are discussed in more detail below.

The control circuit 64 can generate a plurality of control signals to control and provide test signals to the other components of the redundant conversion system 60. The control circuit 64 can provide control signals to control the multiplexing operation of the first and second multiplexers MUX1, MUX2, including controlling the selection and ordering of corresponding input signals V1-VX, DOUT1, DOUT2, COUTA, COUTBi in corresponding multiplexed output signals AIN, OUT. The control circuit 64 can also provide control signals to control the operation of the first and second analog-to-digital converters ADC1, ADC2 to convert the multiplexed analog input signal AIN to the first and second digital output signals DOUT1, DOUT2. The control circuit 64 can further provide control signals to control the operation of the comparison circuit COMP to receive and compare the first and second digital outputs DOUT1, DOUT2 to generate the overall and bitwise comparison signals COUTA, COUTBi. The various control signals discussed above can include clock signals, switch enable and disable signals, register transfer control signals, or any other control signal that may be needed by embodiments of components of the system 60 for regular or testing operation. The control circuit 64 can also provide testing input signals to the first multiplexer MUX1, first and second converters ADC1, ADC2, or both, during testing of the conversion system 60, as discussed further below.

Note that for illustrative simplicity, all connections between components of the redundant conversion system 60 are shown in FIG. 3, and in other figures discussed below (e.g., FIGS. 5, 6, and 8) with single connection lines. However, such illustrations are only schematic representations, and each connection between components of actual redundant system embodiments can be implemented with one or more conductive lines, as is necessary to communicate any of the associated signals in any combination of analog, digital, single-ended, differential, serial and parallel formats, as discussed herein. For example, the single depicted connection line connecting the control circuit 64 to the input multiplexer MUX1 can schematically represent one or more actual signal delivery lines delivering both control signals and test inputs to the input multiplexer MUX1 from the control circuit 64.

The comparison circuit COMP can be implemented in a variety of embodiments. The comparison circuit COMP can include one or more storage circuits to receive and store the first and second digital outputs DOUT1, DOUT2 from the first and second converters ADC1, ADC2, and one or more analog comparators, digital logic circuits, or any combination thereof to implement the bitwise comparison of the first and second digital outputs DOUT1, DOUT2 to generate the one or more comparison outputs COUT.

FIG. 5 depicts an exemplary embodiment of the comparison circuit COMP for a 10-bit first digital output DOUT1 and 7-bit second digital output DOUT2, in which the comparison can be implemented using digital logic. The storage circuits of the comparison circuit COMP can include first and second registers REG1, REG2, each having a plurality of bit storage elements D10-D19, D20-D26, such as latches, memory cells, etc., to store individual bits of the first and second digital outputs DOUT1, DOUT2 respectively. Specifically, the first register REG1 can include a plurality of storage elements D10-D19 arranged to store the bits of the first digital output DOUT1 from its most significant bit (MSB) in storage element D10 to its least significant bit (LSB) in storage element D19, and the second register REG2 can include a plurality of storage elements D20-D26 arranged to store the bits of the second digital output DOUT2 from its MSB in storage element D20 to its LSB in storage element D26. The digital logic can include a plurality of two-input XOR gates, or other equivalent digital logic circuitry, to receive signals representing the individual corresponding bits of the first and second digital outputs DOUT1, DOUT2, and generate the plurality of individual bitwise comparison outputs COUTBi (i.e., COUTB0-COUTB6) corresponding to a comparison of these bit pairs. The digital logic can also include a multi-input OR gate, or other equivalent digital logic circuitry, to receive the bitwise comparison outputs COUTi and generate the single overall comparison output COUTA as the single-bit indicator representing an overall result of the comparison of the first and second digital outputs DOUT1, DOUT2. In embodiments in which the overall comparison output COUTA represents a relatively more relaxed comparison of the first and second digital outputs DOUT1, DOUT2, such as indicating whether a predetermined or selectable number of the most significant bits of the second digital output DOUT2 match each of the corresponding most significant bits of the first digital output DOUT1, the comparison circuit can include suitable digital logic or other circuitry to formulate the overall comparison output COUTA from the bitwise comparison outputs COUTBi.

The comparison circuit COMP can optionally omit storage circuits to receive and store the first and second digital outputs DOUT1, DOUT2, such as, e.g., the first and second registers REG1, REG2 in the embodiment of FIG. 5, and can instead include analog or digital comparison circuits, such as the digital logic of FIG. 5, configured to receive the individual bits of the digital outputs DOUT1, DOUT2 from storage circuits located elsewhere in the conversion system 60. For example, the first and second converters ADC1, ADC2, can optionally include storage circuits, such as registers, latches, memory cells, or any combination thereof, configured to deliver the individual bits of the first and second digital outputs DOUT1, DOUT2 to analog or digital logic of the comparison circuit COMP. Alternatively, storage elements to hold the first and second digital outputs DOUT1, DOUT2 for delivery to the comparison circuit COMP can be located outside both the converters ADC1, ADC2 and the comparison circuit COMP, such as in a circuit in the signal flow between the converters ADC1, ADC2 and comparison circuit COMP.

Figure 6:
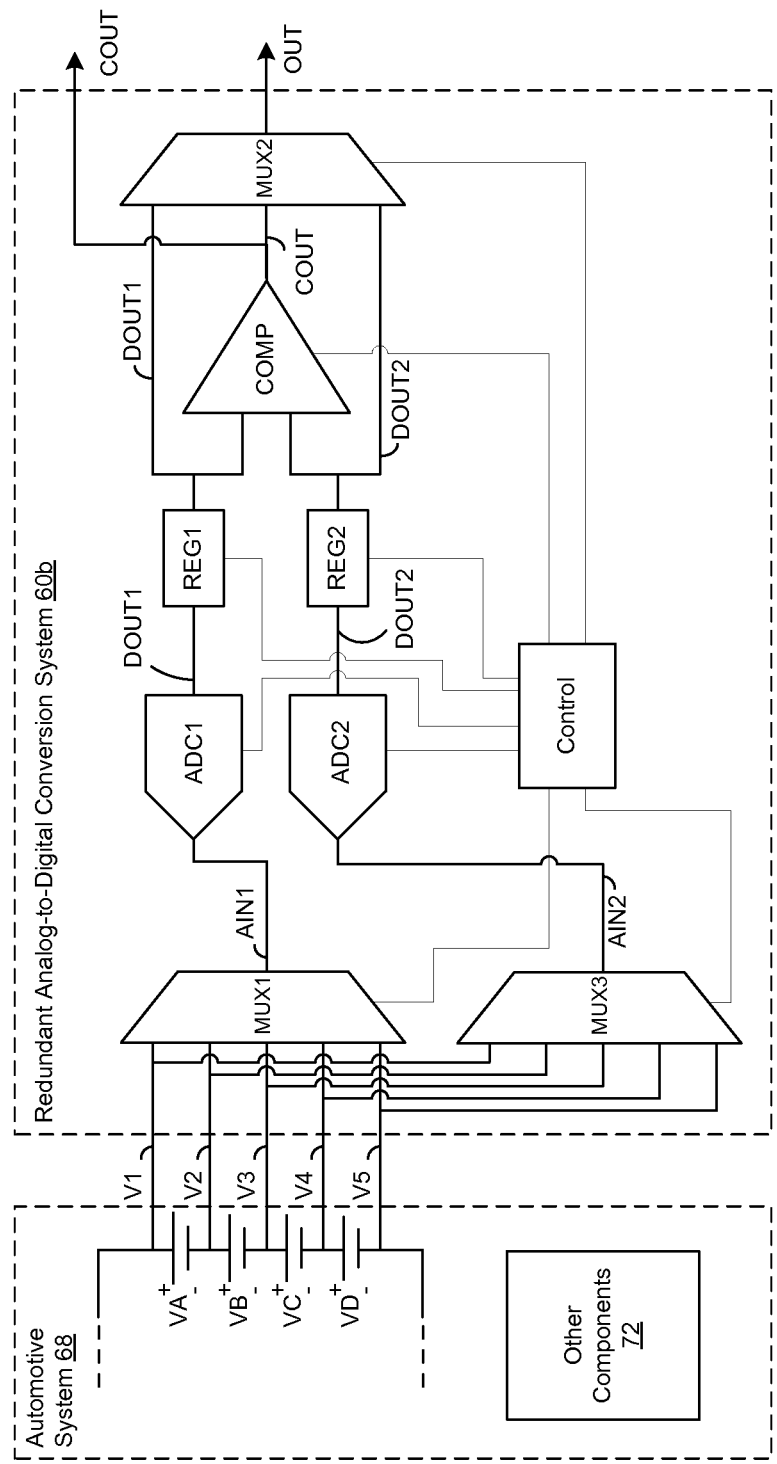
FIG. 6 is a circuit schematic depicting another embodiment of the redundant conversion system.

FIG. 6 depicts another embodiment 60b of the redundant electronic conversion system 60, illustrating some exemplary variations of the system 60. In FIG. 6, two separate input multiplexers MUX1, MUX3, including the first multiplexer MUX1 and a third multiplexer MUX3, can be used to deliver selected ones or combinations of the automotive voltages V1-VX as a plurality of analog input signals AIN1, AIN2. The plurality of multiplexers MUX1, MUX3 can be controlled to deliver identical first and second multiplexed analog inputs AIN1, AIN2 so that the redundant nature of the operation of the plurality of converters ADC1, ADC2 can be maintained. For simplicity of illustration, FIG. 6 depicts an exemplary five analog input signals V1-V5, although other embodiments may have different numbers of inputs V1-VX. In FIG. 6, the first and second registers REG1, REG2 of FIG. 5, to receive and store the digital outputs DOUT1, DOUT2 for comparison, can be separate circuits between the converters ADC1, ADC2 and comparison circuit COMP. In FIG. 6, the control circuit 64 can also deliver test input signals for conversion during testing either directly to the conversion inputs of the plurality of converters ADC1, ADC2, or to the first and third multiplexers MUX1, MUX3 for delivery as the analog input signals AIN1, AIN2 instead of the plurality of voltages V1-VX. As depicted in FIG. 6, the redundant conversion system 60 can also optionally directly output embodiments of the at least one comparison output COUT, in addition to the multiplexed output OUT. In another embodiment, the inputs to the third multiplexer MUX3 may be separate from, and not directed tied to, the inputs of the first multiplexer MUX1. In such an embodiment, the inputs to the third multiplexer MUX3 may be provided as another set of inputs to the redundant conversion system 60, in addition to the inputs to the first multiplexer MUX1.

Figure 7:
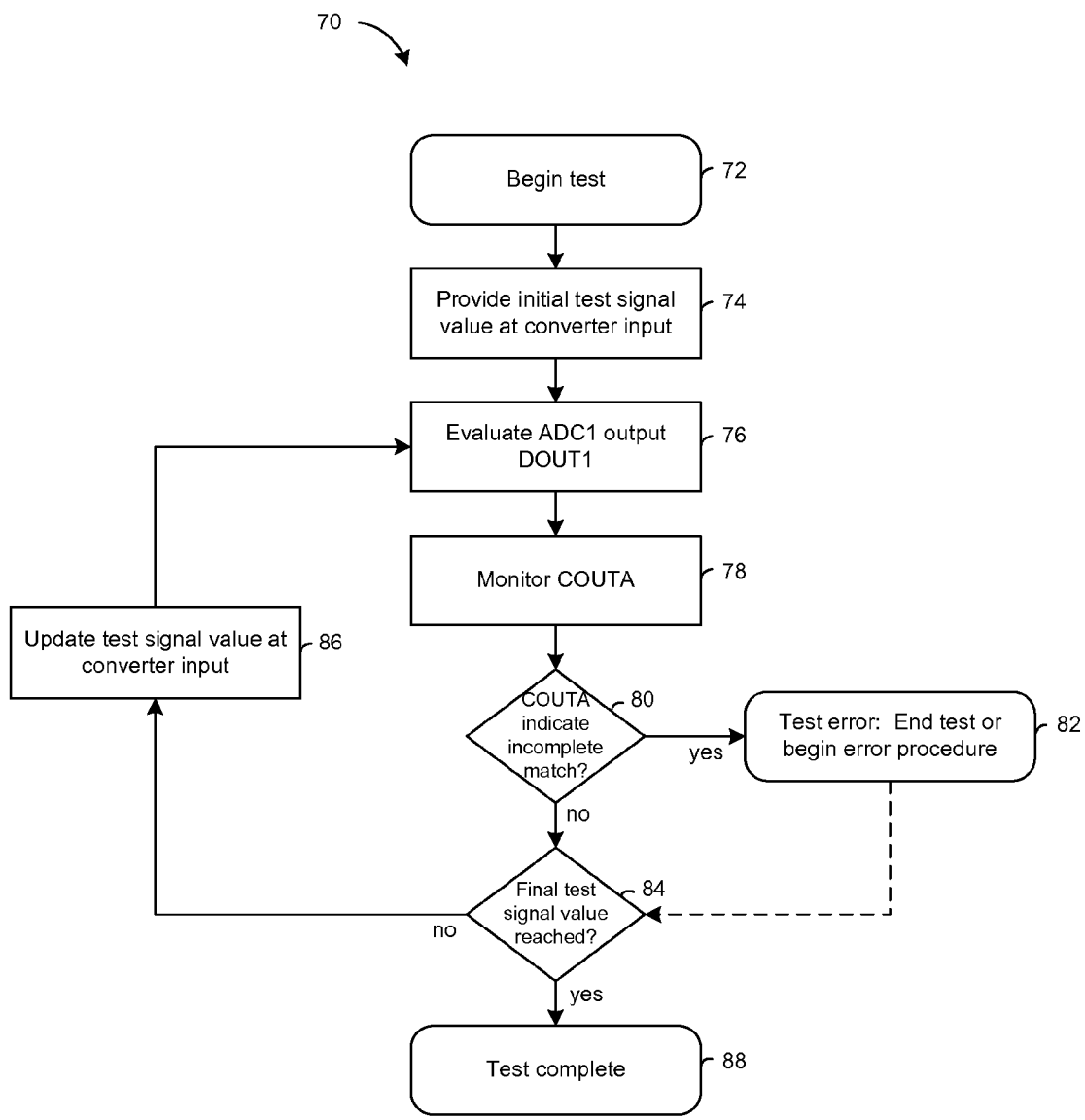
FIG. 7 is a flowchart depicting an embodiment of a testing method suitable for use with the redundant conversion system of FIGS. 3 and 6.

The redundant conversion system 60 can be operated according to a method 70 of testing the redundant converters ADC1, ADC2 to evaluate performance, safety and other measures that may result from various performance and safety standards. FIG. 7 depicts an embodiment of the method 70 of testing the redundant conversion system 60. Embodiments of the testing method 70, as well as embodiments of the conversion system 60 generally, can be utilized in many different environments, including manufacturing, operational, servicing and other environments.

The test method 70 can begin at step 72. Next, at step 74, an initial value of a test voltage can be provided as inputs to both the first and second converters ADC1, ADC2 for conversion to digital outputs DOUT1, DOUT2. The initial and other test values can be provided either directly to the converters ADC1, ADC2 by the control circuit 64, or as a special input to the first multiplexer MUX1 (or, in the case of the embodiment 60b of FIG. 6, the first and third multiplexers MUX1, MUX3) by the control circuit 64 and then delivered to the converters ADC1, ADC2 as the multiplexed input AIN under the control of the control circuit 64.

At step 76, the digital output DOUT1 of the first converter ADC1, representing a conversion of and corresponding to the provided initial test value, can be evaluated. Such an evaluation can include any evaluation sub-steps necessary to implement any degree of evaluation of the performance of the first converter ADC1 that may be desired, such as to determine one or more of whether first digital output DOUT1 is the correct digital code to correspond to the provided specific test value, and whether the first digital output DOUT1 meets other performance measures in relation to previous or future values of the first digital output DOUT1, such as measures of linearity, offset error, gain error, signal-to-noise ratio, total harmonic distortion, etc. The evaluation of step 76 can be performed by or at least partially by the control circuit 64. Also, the evaluation of step 76 can be started at step 76 and at least partially performed simultaneously with, before, or after other steps of the test method 70.

At step 78, the overall comparison output COUTA provided by the comparison circuit COMP can be monitored to determine its value as a result of the comparison of the second digital output DOUT2 to the corresponding bits of the first digital output DOUT1. A first predetermined overall comparison output value can be assigned, e.g., through the implementation of specific digital logic of the comparison circuit COMP, to indicate a complete or a predetermined or selectably sufficient match between the second digital output DOUT2 and the corresponding portion of the first digital output DOUT1, and a second predetermined overall comparison output value can be assigned to indicate an incomplete or insufficient match. For example, the comparison circuit COMP can be designed to output an overall comparison output digital value of "1" for a complete or sufficient match, and "0" for an incomplete or insufficient match, or vice versa. Step 78 can be performed in whole or in part either before, during, or after the evaluation at step 76.

At step 80, a decision can be made based on the value of the overall comparison output COUTA. If the overall comparison output COUTA indicates that each or a sufficient number of the corresponding bits of the first and second digital outputs DOUT1, DOUT2 match, i.e., are the same digital values, then the method can proceed to step 84. However, if at step 80, the comparison output COUTA indicates that the corresponding bits of the first and second digital outputs DOUT1, DOUT2 do not completely or sufficiently match, i.e., are not all or a sufficient number thereof the same corresponding digital values, then the method can proceed to step 82.

At step 82, the test method 70 can either end, resulting in a general failure indication from testing of the redundant conversion system 60, or transition to additional testing procedures to further evaluate errors encountered. Such additional procedures can include outputting and examining the individual bitwise comparison outputs COUTBi (which can also have assigned predetermined values to indicate matching and non-matching corresponding bit pairs of the first and second digital outputs DOUT1, DOUT2) to determine which corresponding bit pairs do not match, and basing safety, functionality and performance decisions for the redundant conversion system 60 on these individual bitwise comparison outputs COUTBi. For example, if only one or a small number of the individual bitwise comparison outputs COUTBi indicates an error, i.e., non-matching corresponding bit pairs, a corrective procedure can optionally correct the values of one or more bits of the first or second digital outputs DOUT1, DOUT2 corresponding to the current test value of the analog input signal AIN. Such a correction can may be implemented for regular operation of the conversion system 60, to correct for the detected error, under appropriate circumstances. At step 82, the test can also optionally proceed forward to step 84, and continue with performance of the test method 70 to monitor and evaluate the first and second digital outputs DOUT1, DOUT2 at each possible converter input value to create a log of each error encountered before ending the test 70.

One or more of the individual comparison outputs COUTBi can also be optionally monitored and evaluated directly at step 78, in addition to or instead of the monitoring of the overall comparison output COUTA at step 78, the monitoring of the individual bitwise comparison outputs COUTBi at step 82, or both. In such an embodiment, the decision at step 80 can be based on the values of the overall comparison output COUTA, the individual bitwise comparison outputs COUTBi, or any combination thereof.

At step 84, the test method 70 can determine whether a final value of the test input has been reached. The test method 70 can optionally provide a plurality of test values to the inputs of the converters ADC1, ADC2 to elicit each possible value of the first and second digital outputs DOUT1, DOUT2 from the converters ADC1, ADC2. Thus, at step 84, the method 70 can determine if it has attempted to elicit each possible value of the first digital output DOUT1, and if so, proceed to step 88, or if not, proceed to step 86. If a final test value has been reached, the method 70 can proceed to step 88, at which point the test method 70 can end.

If a final test value has not yet been reached, the method 70 can proceed to step 86, where the test signal value provided as the input to the first and second converters ADC1, ADC2 can be updated. The test method 70 can then go back to step 76, at which point the method 70 can proceed as described above to evaluate the first digital output DOUT1 produced by the newly provided test input value, then proceed to step 78, etc. At step 86, the test input value can be updated to attempt to elicit digital output values in a particular order, e.g., an ascending or descending digital order. In embodiments of the test method 70, steps 84, 86, and 74, or portions thereof, can be implemented by providing a test signal such as a ramp signal, sine wave signal, etc., or any combination thereof, to the input of the converters ADC1, ADC2 for a desired number of signal cycles or length of time, so as to perform the desired amount of testing.

Embodiments of the test method 70 depicted in FIG. 7 may be used for testing the redundant conversion system 60 both during and not during regular operation to convert actual received input signals V1-VX to digital signals. During regular operation to convert received input signals V1-VX, multiplexing of the inputs V1-VX can be temporarily suspended to provide the test input in step 74 to conduct the test method 70. Alternatively, another test method can be substantially the same as the method 70 depicted in FIG. 7, but with the actual received input signals V1-VX, delivered as part of the multiplexed analog input signal AIN, used to conduct the testing instead of a separate test input generated and provided by the control circuit 64. Such an embodiment may be especially useful if performance and safety testing is desired to be conducted on the fly, during regular conversion operation, but it is not desirable to suspect the conversion of the received inputs V1-VX for various operational reasons.

Figure 8:
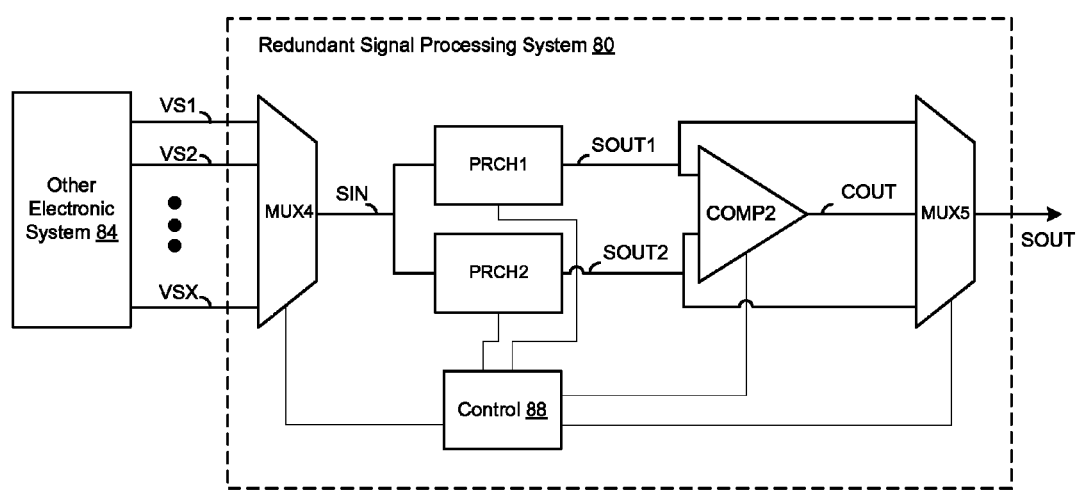
FIG. 8 is a circuit schematic depicting an embodiment of a redundant signal processing system.

The redundant conversion system 60 and test method 70 can be adapted to implement a more general redundant signal processing system 80 and corresponding test method capable of implementing other signal processing functionalities instead of or in addition to analog-to-digital conversion. FIG. 8 depicts an embodiment of a redundant signal processing system 80 having similar components and functionality as the embodiments of the redundant conversion systems 60 depicted in FIGS. 3 and 6, but in which the first and second analog-to-digital converters ADC1, ADC2 are instead replaced with first and second signal processing circuits PRCH1, PRCH2, which can implement one or more of analog-to digital conversion, digital-to-analog conversion, regulation, amplification, filtration, transmission, etc. of a received multiplexed signal SIN to produce first and second signal outputs SOUT1, SOUT2. The signal input SIN and signal outputs SOUT1, SOUT2 each may be either digital (serial or parallel) or analog (single-ended or differential) signals. An input multiplexer MUX4 can receive and multiplex a plurality of voltages VS1-VSX from another electronic system 84 to produce the multiplexed signal input SIN, which can include multiplexed information from each of the plurality of received voltages VS1-VSX. In a typical embodiment, the multiplexer MUX4 may output each of the plurality of input voltages VS1-VSX, or voltages based on selected combinations of the received voltages VS1-VSX, individually as the signal input AIN in a selected order in time.

A comparison block COMP2 may function similarly as described above for the comparison block COMP of the redundant conversion system 60, to produce a comparison of the plurality of signal outputs SOUT1, SOUT2 to test the safety, functionality, and performance of the redundant signal processing system 80. The comparison block COMP2 can implement either analog or digital comparisons of the signal outputs SOUT1, SOUT2, as may be suitable or convenient depending on the specific forms of the signal outputs SOUT1, SOUT2. In one embodiment, the multiplexed input signal SIN can be an analog signal, the processed output signals SOUT1, SOUT2 can be digital signals with one having a greater bit resolution than the other, and the comparison can be a bitwise digital comparison to determine whether and the degree to which corresponding bits of the digital outputs SOUT1, SOUT2 match. In another embodiment, the multiplexed input signal SIN can be a digital signal, the processed output signals SOUT1, SOUT2 can also be digital signals with one having a greater bit resolution than the other, and the comparison can again be a bitwise digital comparison to determine the degree of matching of the outputs SOUT1, SOUT2. In yet another embodiment, the multiplexed input signal SIN can be an analog signal, the processed output signals SOUT1, SOUT2 can also be analog signals, and the comparison can perform an analog signal processing of the first and second outputs SOUT1, SOUT2 to generate a measure of their similarity. Such an analog processing may include a comparison of the frequency content of each signal, a comparison of the magnitude of each signal, and other measures.

A control circuit 88 can generate and provide control signals to the components of the redundant signal processing system 80 to control their operation as described herein. The test method 70 for testing the redundant conversion system 60 can also be used to test the redundant signal processing system 80.

As already indicated above, other embodiments of the redundant conversion system 60, test method 70, and redundant processing system 80 are possible. For example, although the first and second analog-to-digital converters ADC1, ADC2 have been discussed herein as having exemplary bit widths (e.g., a 10-bit first converter ADC1, and a 7-bit second converter ADC2), other bit widths of the first and second converters ADC1, ADC2, or first and second processing channels PRCH1, PRCH2, are possible. The control circuits 64, 88 can also optionally receive various input signals, such as one or more of the analog input signal AIN, the processing signal input SIN, the first and second digital outputs DOUT1, DOUT2, the first and second processing signal outputs SOUT1, SOUT2, the overall comparison output COUTA, and the individual bitwise comparison outputs COUTBi, and deliver further or different control signals than as exemplarily discussed above.

Other digital and analog circuits can also be used to implement the comparison circuits COMP, COMP2. For example, the individual bitwise comparison outputs COUTBi can be produced using different digital logic, yet still each represent a digital comparison of corresponding individual bits of the first and second digital outputs DOUT1, DOUT2 or first and second signal processing outputs SOUT1, SOUT2. Likewise, the overall comparison output COUTA can also be produced using different digital logic, yet still represent an overall result of the comparison of all of the corresponding bit pairs of the first and second digital outputs DOUT1, DOUT2 or first and second signal processing outputs SOUT1, SOUT2. Analog comparators can also be used to perform the comparison functionality to produce one or more of analog or digital individual comparison outputs COUTBi and analog or digital overall comparison output COUTA from the digital outputs DOUT1, DOUT2 or analog or digital forms of the signal processing outputs SOUT1, SOUT2.

The redundant conversion system 60 and redundant signal processing system 80 can also include more than two analog-to-digital converters or more than two processing circuits. For example, embodiments of the redundant systems 60, 80 may include more than one primary converter or processing circuit supported by a single secondary or backup converter or processing circuit, or alternatively a single primary converter or processing circuit supported by more than one secondary or backup converter or processing circuit.

Embodiments can also optionally omit the first or third multiplexer MUX1, MUX3 and deliver input signals directly to the converters ADC1, ADC2 or processing channels PRCH1, PRCH2. Embodiments of the redundant conversion system 60 may also output some or all of the first digital output DOUT1, second digital output DOUT2, overall comparison output COUTA and individual bitwise comparison outputs COUTBi directly, in addition to or instead of as part of the multiplexed output OUT. In some such embodiments, the second multiplexer MUX2 can optionally be omitted.

Embodiments of the redundant conversion and signal processing systems 60, 80 are also not limited to use only with automotive systems, and can instead be used with any type of electronic system producing one or more signals for redundant conversion or processing.

Embodiments of the redundant conversion system 60 and redundant processing system can be implemented as integrated circuits. For example, the redundant conversion system 60 can be implemented on a single integrated circuit chip, having a single semiconductor substrate and having input terminals to receive the plurality of analog input voltages V1-VX from automotive or other electric or electronic components that may or may not be implemented as integrated circuits. The redundant signal processing system 80 can be similarly implemented.

The test method 70 can be embodied by program instructions stored in a storage element or medium, such as a memory circuit or other storage circuit, optionally as part of the control circuits 64, 88, that can be executed by a processor or controller, e.g., the control circuits 64, 88, to implement the test method 70.

Any feature of any of the embodiments of the redundant conversion system 60, test method 70, and redundant processing system 80 can optionally be used in any other embodiment of the redundant conversion system 60, test method 70, or redundant processing system 80. Also, embodiments of the redundant conversion system 60, test method 70, and redundant processing system 80 can optionally include any subset of the components or features of any embodiments of the redundant conversion system 60, test method 70, or redundant processing system 80 described herein.

What is claimed is:

1. A redundant analog-to-digital conversion system, comprising:
    an input multiplexer to receive a plurality of analog input signals and output a multiplexed analog input signal;
    first and second analog-to-digital converters to each convert the multiplexed analog input signal to respective first and second digital output signals having different digital resolutions;
    a comparison circuit to produce a comparison output signal as a function of a comparison of a plurality of most significant bits of the first digital output signal to a corresponding plurality of most significant bits of the second digital output signal; and
    an output multiplexer to produce a multiplexed output signal including information from the comparison output signal and one of the digital output signals.

2. A redundant analog-to-digital conversion system, comprising:
    at least one input multiplexer to receive a plurality of analog input signals and output at least one multiplexed analog input signal;
    first and second analog-to-digital converters to each receive the at least one multiplexed analog input signal and respectively generate first and second digital output signals at different digital resolutions;
    a comparison circuit to produce a comparison output as a function of a comparison of a plurality of most significant bits of the first digital output signal to a corresponding plurality of most significant bits of the second digital output signal; and an output multiplexer to produce a multiplexed output signal including information from the comparison output signal and one of the digital output signals, wherein the comparison output signal includes a single bit indicating if a predetermined number of a plurality of corresponding bit pairs of the first and second digital output signals match.

3. The redundant analog-to-digital conversion system of claim 1, wherein the comparison output signal includes a multi-bit signal, each bit indicating whether a respective corresponding pair of bits of the first and second digital output signals match.

4. The redundant analog-to-digital conversion system of claim 1, further comprising:
a control circuit to:
provide a test signal, and
control the first and second converters to convert the test signal instead of the multiplexed analog input signal.

5. The redundant analog-to-digital conversion system of claim 4, wherein the control circuit provides the test signal to one of: the input multiplexer, or the first and second converters directly.

6. The redundant analog-to-digital conversion system of claim 1, further comprising a plurality of automotive system components to produce the plurality of analog input signals received by the input multiplexer.

7. The redundant analog-to-digital conversion system of claim 6, wherein the plurality of automotive system components include a plurality of batteries.

8. The redundant analog-to-digital conversion system of claim 1, wherein the multiplexed output signal includes only the first number of bits of the first digital output signal and a single overall comparison bit indicating whether each or a predetermined or selectable number of the corresponding most significant bits of the first and second digital output signals match.

9. The redundant analog-to-digital conversion system of claim 1, further comprising a control circuit to control what information is selected from the received plurality of analog input signals by the input multiplexer for inclusion in the multiplexed analog input signal.

10. The redundant analog-to-digital conversion system of claim 1, further comprising a control circuit to control a selection of information from the first and second digital output signals and the at least one comparison signal by the output multiplexer for inclusion in the multiplexed output signal.

11. The redundant analog-to-digital conversion system of claim 10, wherein the control circuit is configured to change the information selected from the first and second digital output signals and the comparison output signal by the output multiplexer for inclusion in the multiplexed output signal in response to the comparison by the comparison circuit indicating an incomplete match between the subset of the first number of bits of the first digital output signal to the second number of bits of the second digital output signal.

12. The redundant analog-to-digital conversion system of claim 1, wherein the comparison circuit includes a plurality of digital logic circuits, each receiving a pair of signals representing a respective pair of corresponding bits of the first and second digital output signals and generating a bitwise comparison output signal indicating whether digital values of the received pair of signals match.

13. The redundant analog-to-digital conversion system of claim 1, wherein the comparison circuit includes a digital logic circuit to receive a plurality of bitwise comparison signals, each representing an indication of whether a respective pair of corresponding bits of the first and second digital output signals match, and generate an overall comparison output signal indicating whether each of the bitwise comparison output signals indicates a match between its respective pair of corresponding bits of the first and second digital output signals.

14. The redundant analog-to-digital conversion system of claim 2, comprising first and second input multiplexers to receive the plurality of analog input signals and output the at least one multiplexed analog input signal, wherein the first analog-to-digital converter receives the multiplexed analog input signal from the first input multiplexer, and the second analog-to-digital converter receives the multiplexed analog input signal from the second input multiplexer.

15. A method of testing a redundant analog-to-digital conversion system, comprising:
converting an analog input signal by first and second analog-to-digital converters to respectively produce first and second digital output signals having different digital resolutions;
comparing a plurality of most significant corresponding bit pairs of the first and second digital output signals to produce a comparison output signal; and
outputting a multiplexed output signal including information from the comparison output signal and one of the digital output signals.

16. The method of claim 15, wherein the comparison output signal is a single bit indicating if each or a predetermined or selectable number of a plurality of corresponding bit pairs of the first and second digital output signals match.

17. The method of claim 16, wherein the multiplexed output signal includes only the first digital output signal and the comparison output signal.

18. The method of claim 15, wherein the comparison output signal is a multi-bit signal, each bit indicating whether a respective corresponding pair of bits of the first and second digital output signals match.

19. The method of claim 15, further comprising generating and providing the analog input signal to the first and second analog-to-digital converters.

20. The method of claim 15, further comprising selecting information from the first and second digital output signals and the comparison output signal for inclusion in the multiplexed output signal.

21. The method of claim 20, further comprising changing the information selected from the first and second digital output signals and the comparison output signal for inclusion in the multiplexed output signal in response to the comparing indicating an incomplete match between the corresponding most significant bits of the first and second digital output signals.

22. The method of claim 15, further comprising generating a plurality of bitwise comparison output signals, each indicating whether a respective one of a plurality of pairs of corresponding bits of the first and second digital output signals match.

23. The method of claim 22, further comprising generating an overall comparison output bit of the comparison output signal, indicating whether each or a predetermined or selectable number of the bitwise comparison output signals indicates a match between its respective pair of corresponding bits of the first and second digital output signals.

24. A redundant automotive analog-to-digital conversion system, comprising:
- a plurality of automotive system components to produce a plurality of analog input signals;
- at least one input multiplexer to receive a plurality of analog input signals and output at least one multiplexed analog input signal;
- first and second analog-to-digital converters to each receive the at least one multiplexed analog input signal and respectively generate first and second digital output signals at different digital resolutions;
- a comparison circuit to produce a comparison output as a function of a comparison of a plurality of most significant corresponding bit pairs of the first and second digital output signals; and
- an output multiplexer to produce a multiplexed output signal including information from the comparison output signal and one of the digital output signals.

25. The redundant automotive analog-to-digital conversion system of claim 24, wherein the plurality of automotive system components include a plurality of batteries.

26. The redundant automotive analog-to-digital conversion system of claim 24, wherein the comparison output signal is a single bit indicating if each or a predetermined or selectable number of a plurality of corresponding bit pairs of the first and second digital output signals match.

27. The redundant automotive analog-to-digital conversion system of claim 24, wherein the comparison output signal is a multi-bit signal, each bit indicating whether a respective corresponding pair of bits of the first and second digital output signals match.

28. The redundant automotive analog-to-digital conversion system of claim 24, further comprising:
- a control circuit to:
  - provide a test signal, and
  - control the first and second converters to convert the test signal instead of the multiplexed analog input signal.

29. The redundant automotive analog-to-digital conversion system of claim 28, wherein the control circuit provides the test signal to one of: the input multiplexer, or the first and second converters directly.

30. The redundant automotive analog-to-digital conversion system of claim 24, comprising first and second input multiplexers to receive the plurality of analog input signals and output the at least one multiplexed analog input signal, wherein the first analog-to-digital converter receives the multiplexed analog input signal from the first input multiplexer, and the second analog-to-digital converter receives the multiplexed analog input signal from the second input multiplexer.

31. The redundant analog-to-digital conversion system of claim 1, wherein the comparison output signal includes a single bit indicating if a predetermined number of a plurality of corresponding bit pairs of the first and second digital output signals match.

* * * * *